United States Patent
Chen et al.

(10) Patent No.: US 8,596,338 B2
(45) Date of Patent: Dec. 3, 2013

(54) SEPARABLE LIQUID-COOLING HEAT-DISSIPATION MODULE

(75) Inventors: Chien-An Chen, Taipei (TW); Yi-Ling Chen, Taipei (TW)

(73) Assignee: Inventec Corporation, Taipei (TW)

( * ) Notice: Subject to any disclaimer, the term of this patent is extended or adjusted under 35 U.S.C. 154(b) by 359 days.

(21) Appl. No.: 13/014,119

(22) Filed: Jan. 26, 2011

(65) Prior Publication Data

US 2012/0125586 A1    May 24, 2012

(30) Foreign Application Priority Data

Nov. 19, 2010 (TW) ................................ 99139972 A

(51) Int. Cl.
*F28F 1/00* (2006.01)

(52) U.S. Cl.
USPC ........................... 165/80.4; 165/135; 361/699

(58) Field of Classification Search
USPC .............. 165/80.3, 80.4, 80.5, 135, 144, 153, 165/172, 182; 174/15.2; 361/699, 701, 711
See application file for complete search history.

(56) References Cited

U.S. PATENT DOCUMENTS

| | | | | |
|---|---|---|---|---|
| 5,163,507 A | * | 11/1992 | Joshi | 165/135 |
| 5,186,243 A | * | 2/1993 | Halstead | 165/135 |
| 5,574,627 A | * | 11/1996 | Porter | 361/719 |
| 6,704,200 B2 | | 3/2004 | Zeighami et al. | |
| 6,807,056 B2 | * | 10/2004 | Kondo et al. | 361/689 |
| 6,828,675 B2 | * | 12/2004 | Memory et al. | 257/714 |
| 6,994,151 B2 | | 2/2006 | Zhou et al. | |
| 7,187,549 B2 | * | 3/2007 | Teneketges et al. | 361/699 |
| 7,377,554 B2 | * | 5/2008 | Motomura et al. | 285/136.1 |
| 7,455,101 B2 | | 11/2008 | Hsu | |
| 7,614,247 B2 | * | 11/2009 | Nicolai et al. | 62/259.2 |
| 7,679,909 B2 | * | 3/2010 | Spearing et al. | 361/699 |
| 7,694,721 B2 | * | 4/2010 | Lai et al. | 165/80.4 |
| 7,753,662 B2 | * | 7/2010 | Lai et al. | 417/423.9 |
| 7,768,783 B1 | * | 8/2010 | Kajiya et al. | 361/700 |
| 7,808,791 B2 | * | 10/2010 | Li et al. | 361/719 |
| 2006/0076128 A1 | * | 4/2006 | Pascuzzi | 165/172 |
| 2007/0074861 A1 | * | 4/2007 | Higashiyama | 165/174 |
| 2008/0099189 A1 | | 5/2008 | Suh et al. | |

* cited by examiner

*Primary Examiner* — Allana Lewin
*Assistant Examiner* — Kun Kai Ma
(74) *Attorney, Agent, or Firm* — WAPT, PC; Justin King

(57) ABSTRACT

A separable liquid-cooling heat-dissipation module has a first flow pipe, a second flow pipe, and a plurality of heat conduction blocks. The second flow pipe is set on a top end of the first flow pipe. A bottom end of the second flow pipe has a gap, so that a heat-insulating structure is formed between the first flow pipe and the second flow pipe. The heat conduction blocks are installed on both sides of the first flow pipe and the second flow pipe. A combination of the first flow pipe, the second flow pipe, and the heat conduction blocks provides a modular heat-dissipation structure and also achieves effects of heat-dissipation and energy-saving.

13 Claims, 3 Drawing Sheets

SEPARABLE LIQUID-COOLING HEAT-DISSIPATION MODULE

BACKGROUND OF THE INVENTION

1. Field of Invention

The present invention relates to a separable liquid-cooling heat-dissipation module, which provides a modular structure formed by combining a plurality of heat conduction blocks in combination with pipelines, so as to eliminate a disorderly state of pipelines and achieve the effects of heat-dissipation and energy-saving.

2. Related Art

In recent years, the heat dissipation problem for computers is always an important issue, especially for servers. Common heat-dissipation methods include a gas-cooling mode and a liquid-cooling mode.

In the gas-cooling heat dissipation mode, heat-sink fin groups are adhered to electronic components that need heat dissipation, for example, a central processing unit (CPU) or a memory. Then, heat energy generated by the electronic components is conducted to the heat-sink fin groups. Then, heat-sink fans blow the heats to the open air, thereby achieving the effect of heat dissipation.

In the liquid-cooling heat dissipation mode, a heat conduction block is adhered to electronic components that need heat dissipation and has a water channel, in which the water channel is respectively connected to a water flow-in pipe and a water flow-out pipe. Heat energy generated by the electronic components is conducted to the heat conduction block, and a coolant enters the heat conduction block via the water flow-in pipe, and then leaves the heat conduction block via the water flow-out pipe, thereby taking the heat energy away and achieving the heat dissipation effect.

Both the above two heat dissipation modes can achieve the heat dissipation effect and the two modes have their respective defects. The gas-cooling heat dissipation mode mainly relies on heat-sink fans, but the heat-sink fans produce a lot of noises during operation, and a high cost is required for solving the noise problem. Thus, the gas-cooling heat dissipation mode is restricted by the equipment cost problem and the noise problem. In addition, the heat-sink fans consume a lot of electric energy during operation.

The liquid-cooling heat dissipation mode mainly uses a coolant. However, the current devices adopting the liquid-cooling heat dissipation mode can only be used for a single electronic component. If a plurality of electronic components requires heat dissipation, a plurality of groups of devices needs to be installed, resulting in disorderly pipelines within the computer or server, and even worse, the problem of coolant leakage may probably occur.

To sum up, the common gas-cooling heat dissipation mode and liquid-cooling heat dissipation mode respectively have the above defects, so that the existing heat dissipation modes further need to be improved to a large extent.

SUMMARY OF THE INVENTION

In view of the above defects, the present invention is directed to a separable liquid-cooling heat-dissipation module, in which a plurality of heat conduction blocks and pipelines are modularized, so as to eliminate a disorderly state of pipelines and avoid a problem of coolant leakage caused by disorderly pipelines. In addition, phase state conversion of a refrigerant is used to realize automatic cycling of the refrigerant, thereby achieving the effects of heat-dissipation and energy-saving.

In order to achieve the above objective, the present invention provides a separable liquid-cooling heat-dissipation module, which comprises a first flow pipe, a second flow pipe, and a plurality of heat conduction blocks. The first flow pipe has a first flow channel and a plurality of flow-out holes. The flow-out holes are respectively located at two sides of the first flow pipe, and are communicated with the first flow channel. The first flow pipe has a gap at a bottom end. The second flow pipe is set on a top end of the first flow pipe and has a gap at a bottom end. The second flow pipe has a second flow channel and a plurality of flow-in holes. The flow-in holes are communicated with the second flow channel, and are respectively located at two sides of the second flow pipe. Each heat conduction block has a water channel respectively connected to an inlet pipe and an outlet pipe. The other end of each inlet pipe is connected to the corresponding flow-out hole, and the other end of each outlet pipe is connected to the corresponding flow-in hole.

An end of the first flow pipe is connected to a flow-in pipe communicated with the first flow channel. An end of the second flow pipe is connected to a flow-out pipe communicated with the second flow channel. The other end of the flow-in pipe and the other end of the flow-out pipe are connected with a quick coupler. The quick coupler has a flow-in hole and a flow-out hole, in which the flow-in hole is connected to the flow-in pipe, and the flow-out hole is connected to the flow-out pipe. An end of the first flow pipe and an end of the second flow pipe are disposed with a seal plate, and a leak proof washer is respectively disposed between the seal plate and the first flow pipe and the second flow pipe.

A hole sectional area of the second flow channel is approximately twice as much as a pipe sectional area of the outlet pipe, the pipe sectional area of the outlet pipe is larger than that of the inlet pipe, and the hole sectional area of the second flow channel equals that of the first flow channel.

Each heat conduction block has a through hole respectively located at two opposite angles. Each through hole is disposed with a fixture, and the fixture has an elastomer.

With the above structure, each heat conduction block may be disposed at an electronic component which needs heat dissipation within a server. A liquid-state refrigerant at a low temperature sequentially flows into the first flow channel and the water channel from the flow-in pipe, and absorbs heat energy generated by the electronic components, so as to realize heat dissipation for the electronic components. Thus, the liquid-state refrigerant at a low temperature is converted into gas-state refrigerant at a high temperature, which passes through the second flow channel and the flow-out pipe, and leaves the second flow pipe, and is converted back to the liquid-state refrigerant at a low temperature.

Through the phase state conversion, the refrigerant produces an automatic cycling effect, so as to realize effects of heat-dissipation and energy-saving. In addition, with the structure combined by a plurality of heat conduction blocks with the first flow pipe and the second flow pipe, the liquid-cooling heat dissipation device modularized, thereby reducing the number of pipelines to be configured within the server for cooling, eliminating a disorderly state of pipelines, and preventing a possible problem of coolant leakage caused by pipelines.

Furthermore, the gap of the second flow pipe forms an isolating and heat-insulating structure between the first flow pipe and the second flow pipe, so that the influences on the liquid-state refrigerant at a low temperature flowing in the first flow pipe caused by the gas-state refrigerant at a high temperature flowing in the second flow pipe are reduced to the minimum level, so that the liquid-state refrigerant at a low temperature can achieve an optimal heat-dissipation effect.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The implementation of the present invention is described below through specific embodiments, and those skilled in the art can easily understand other advantages and efficacy of the present invention based on the disclosure of the specification.

Figure 1:
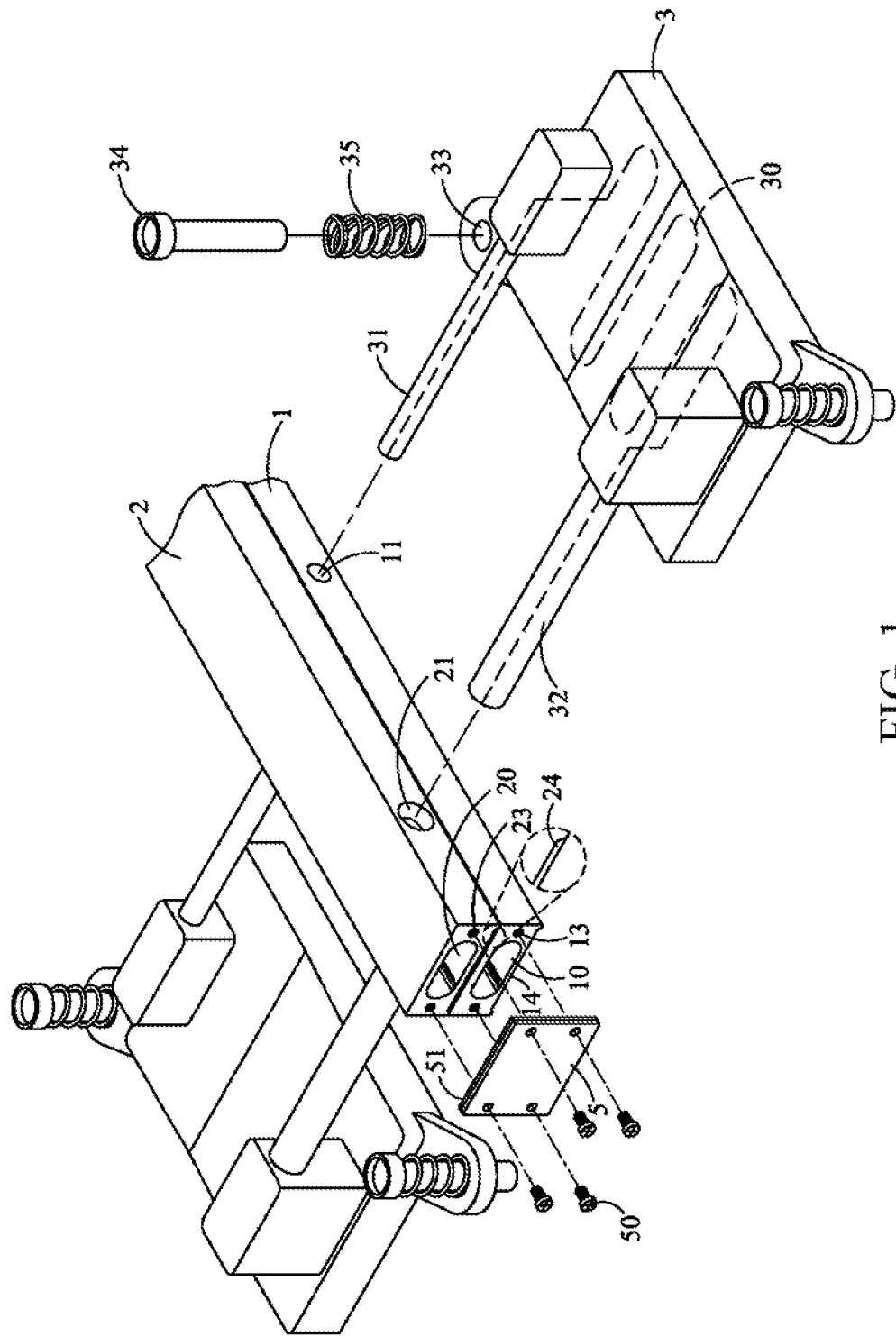
FIG. 1 is a partial three-dimensional exploded view of a separable liquid-cooling heat-dissipation module according to the present invention.
Figure 2:
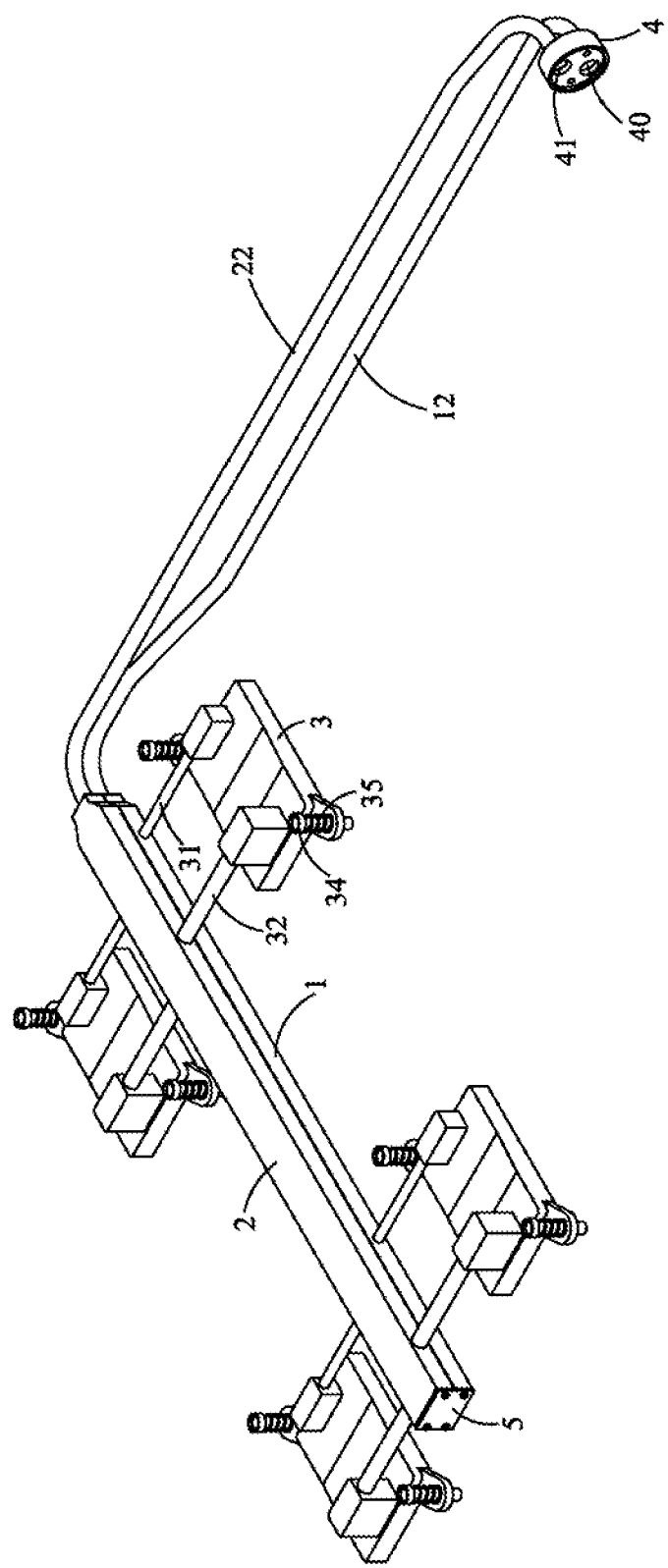
FIG. 2 is a three-dimensional outside view of a separable liquid-cooling heat-dissipation module according to the present invention.

Referring to FIG. 1 and FIG. 2, a separable liquid-cooling heat-dissipation module of the present invention has a first flow pipe 1, a second flow pipe 2, a plurality of heat conduction blocks 3, and a quick coupler 4.

The first flow pipe 1 has a first flow channel 10, and a plurality of flow-out holes 11 respectively at two sides of the first flow pipe 1. The flow-out holes 11 are communicated with the first flow channel 10. An end of the first flow pipe 1 is connected with a flow-in pipe 12, and the other end has two fixing holes 13. The first flow pipe 1 has a gap 14 at a bottom end. In addition, the flow-in pipe 12 is communicated with the first flow channel 10.

The second flow pipe 2 is set on a top end of the first flow pipe 1 and has a second flow channel 20, and a plurality of flow-in holes 21 are respectively located at two sides of the second flow pipe 2. The flow-in holes 21 are communicated with the second flow channel 20. An end portion of an end of the second flow pipe 2 has two fixing holes 23, and the other end is connected with a flow-out pipe 22. A gap 24 is formed between the second flow pipe 2 and the first flow pipe 1, so as to reduce a contact area between the second flow pipe 2 and the first flow pipe 1 and form an isolating and heat-insulating structure. In addition, the flow-out pipe 22 is communicated with the second flow channel 20.

A seal plate 5 is disposed at positions of the first flow pipe 1 and the second flow pipe 2 having the fixing holes 13 and 23. A plurality of fixtures 50 passes through the seal plate 5, and is screwed at the fixing holes 13 and 23, so that the seal plate 5 is fixed at end portions of the first flow pipe 1 and the second flow pipe 2. A leak proof washer 51 is respectively disposed between the seal plate 5 and the first flow pipe 1 and the second flow pipe 2, so as to prevent the leakage phenomenon between the first flow channel 10 and the second flow channel 20.

Each heat conduction block 3 has a water channel 30 respectively connected to an inlet pipe 31 and an outlet pipe 32. The other end of each inlet pipe 31 is connected to the corresponding flow-out hole 11, and the other end of each outlet pipe 32 is connected to the corresponding flow-in hole 21. Each heat conduction block 3 has a through hole 33 respectively located at two opposite angles. Each through hole 33 is disposed with a fixture 34, and the fixture 34 has an elastomer 35. The elastomer 35 may be a spring. A cross-sectional area of the inlet pipe 31 is smaller than that of the outlet pipe 32, and the cross-sectional area of the outlet pipe 32 is smaller than a cross-sectional area of the second flow channel 20, and the cross-sectional area of the second flow channel 20 equals that of the first flow channel 10.

The quick coupler 4 has a flow-in hole 40 and a flow-out hole 41. The flow-in hole 40 is connected to the flow-in pipe 12, and the flow-out hole 41 is connected to the flow-out pipe 22.

Figure 3:
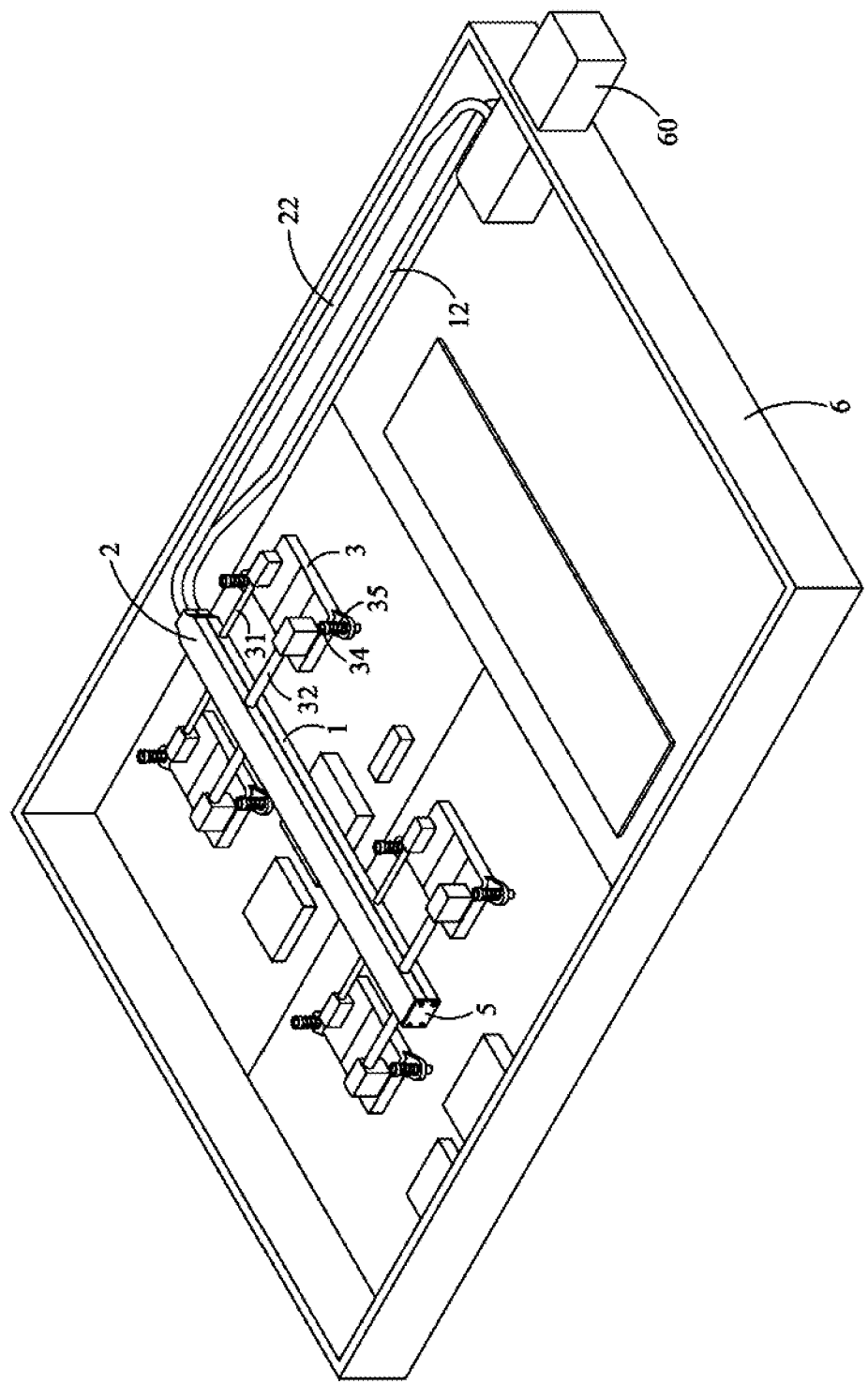
FIG. 3 is a schematic three-dimensional view of a separable liquid-cooling heat-dissipation module according to the present invention when being installed in a server.

Referring to FIG. 3, a server 6 has a plurality of electronic components which need heat dissipation therein. Each heat conduction block 3 is disposed at a position corresponding to the electronic component. An end of each fixture 34 is fastened within the server 6. Each elastomer 35 forces the heat conduction block 3 to be further closely adhered to the electronic component.

The quick coupler 4 is connected to a refrigerant source 60. A liquid-state refrigerant at a low temperature coming from the refrigerant source 60 sequentially passes through the flow-in hole 40 and the flow-in pipe 12, enters the first flow channel 10, and then passes through the flow-out holes 11 and the inlet pipe 31, and enters the water channel 30.

The heat energy generated by the electronic components during operation is conducted to the heat conduction blocks 3, and the liquid-state refrigerant at a low temperature within the water channel 30 absorbs the heat energy, so as to realize an objective of heat dissipation for the electronic components. Then, after absorbing the heat energy, the liquid-state refrigerant at a low temperature is converted into gas-state refrigerant at a high temperature.

The gas-state refrigerant at a high temperature passes through the outlet pipes 32 and the flow-in holes 21, enters the second flow channel 20, and then returns to the refrigerant source 60 via the flow-out pipe 22, so as to be converted back to the liquid-state refrigerant at a low temperature. When the gas-state refrigerant at a high temperature passes within the second flow channel 20, the gap 24 reduces a contact area between the second flow pipe 2 and the first flow pipe 1, so that the gap 24 forms an isolating and heat-insulating structure. Thus, the gas-state refrigerant at a high temperature produces no influence on the liquid-state refrigerant at a low temperature flowing within the first flow channel 10, so that the liquid-state refrigerant at a low temperature can achieve the expected heat dissipation effects.

The above differences in cross-sectional area ensure easy flowing of the gas-state refrigerant to, and ensure that the pressure generated by the refrigerant during phase state conversion has a buffering space. Thus, through the phase state conversion, the refrigerant generates an automatic cycling effect, thereby achieving the heat-dissipation and energy-saving effects.

Furthermore, by using the quick coupler 4, the present invention can be quickly connected to or disconnected from the refrigerant source 60, so that the present invention also has conveniences in assembling and disassembling.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A separable liquid-cooling heat-dissipation module, comprising:
a first flow pipe, comprising:
a first flow channel;

a first side, comprising:
    a first flow-out hole, connected to said first flow channel; and
a second side, comprising:
    a second flow-out hole, connected to said first flow channel;
a second flow pipe, disposed on top of said first flow pipe, comprising:
    a first gap, at a bottom side of said second flow pipe;
    a second flow channel,
    a third side, comprising:
        a first flow-in hole, connected to said second flow channel; and
    a fourth side, comprising:
        a second flow-in hole, connected to said second flow channel;
    wherein the bottom of said third side further comprises a first downward protrusion connecting to said first flow pipe, and the bottom of said fourth side further comprises a second downward protrusion connecting to said first flow pipe, such that said first gap is disposed between said first downward protrusion and said second downward protrusion,
a first heat conduction block, comprising:
    a first inlet pipe, comprising:
        a first end; and
        a second end;
    a first outlet pipe, comprising:
        a third end; and
        a fourth end; and
    a first water channel, connected to said second end and said third end;
    wherein said first end is connected to said first flow-out hole, and said fourth end is connected to said first flow-in hole; and
a second heat conduction block, comprising:
    a second inlet pipe, comprising:
        a fifth end; and
        a sixth end;
    a second outlet pipe, comprising
        a seventh end; and
        an eighth end; and
    a second water channel, connected to said sixth end and said seventh end;
    wherein said fifth end is connected to said second flow-out hole, and said eighth end is connected to said second flow-in hole.

2. The separable liquid-cooling heat-dissipation module according to claim 1, wherein the cross-sectional area of said first outlet pipe is smaller than the cross sectional area of said second flow channel.

3. The separable liquid-cooling heat-dissipation module according to claim 1, wherein the cross-sectional area of the said first inlet pipe is smaller than the cross sectional area of said first outlet pipe.

4. The separable liquid-cooling heat-dissipation module according to claim 1, wherein the cross-sectional area of said first flow channel equals the cross-sectional area of said second flow channel.

5. The separable liquid-cooling heat-dissipation module according to claim 1, further comprising:
    a flow-in pipe, connected to an end of said first flow pipe and said first flow channel;
    a flow-out pipe, connected to an end of said second flow pipe and said second flow channel;
    a quick coupler, further comprising:
        an inlet hole, connected to said flow-in pipe; and
        an outlet hole, connected to said flow-out pipe.

6. The separable liquid-cooling heat-dissipation module according to claim 1, wherein said first flow pipe further comprises:
    a second gap, at a bottom side of said first flow pipe.

7. The separable liquid-cooling heat-dissipation module according to claim 1, further comprising:
    a seal plate, disposed at an end of said first flow pipe and an end of said second flow pipe.

8. The separable liquid-cooling heat-dissipation module according to claim 7, further comprising:
    a leak proof washer, disposed between said seal plate, and said first flow pipe and said second flow pipe.

9. The separable liquid-cooling heat-dissipation module according to claim 1, wherein said first heat conduction block further comprises:
    a first through hole, located at a first corner of said first heat conduction block,
    a first fixture, disposed in said first through hole;
    a first elastomer, disposed surrounding said first fixture,
    a second fixture, disposed in said second through hole; and
    a second elastomer, disposed surrounding said second fixture.

10. The separable liquid-cooling heat-dissipation module according to claim 1, wherein said first gap is wider than said second flow channel.

11. The separable liquid-cooling heat-dissipation module according to claim 5, wherein said quick coupler further comprises an outer ring projection.

12. The separable liquid-cooling heat-dissipation module according to claim 6, wherein the bottom of said first side further comprises a third downward protrusion, and the bottom of said second side further comprises a fourth downward protrusion, such that said second gap is disposed between said third downward protrusion and said fourth downward protrusion.

13. The separable liquid-cooling heat-dissipation module according to claim 6, wherein the width of said second gap is wider than said first flow channel.

* * * * *